(12) United States Patent
Watanabe et al.

(10) Patent No.: US 11,223,302 B2
(45) Date of Patent: Jan. 11, 2022

(54) ELECTROSTATIC CHUCK HAVING AN ANNULAR OUTER REGION COVERED BY AN INSULATING FILM

(71) Applicant: NGK INSULATORS, LTD., Nagoya (JP)

(72) Inventors: Reo Watanabe, Handa (JP); Nobuyuki Kondou, Chita-County (JP); Yutaka Unno, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 77 days.

(21) Appl. No.: 16/707,348

(22) Filed: Dec. 9, 2019

(65) Prior Publication Data

US 2020/0111697 A1   Apr. 9, 2020

Related U.S. Application Data

(63) Continuation of application No. PCT/JP2018/038410, filed on Oct. 16, 2018.

(60) Provisional application No. 62/572,697, filed on Oct. 16, 2017.

(51) Int. Cl.
*H02N 13/00* (2006.01)
*H01L 21/683* (2006.01)
*B23Q 3/152* (2006.01)

(52) U.S. Cl.
CPC ............. *H02N 13/00* (2013.01); *B23Q 3/152* (2013.01); *H01L 21/6833* (2013.01)

(58) Field of Classification Search
CPC ..... H02N 13/00; B23Q 3/152; H01L 21/6833
USPC ....................................................... 361/234
See application file for complete search history.

(56) References Cited

U.S. PATENT DOCUMENTS

| 6,287,986 B1 * | 9/2001 | Mihara ................. C23C 14/088 |
| | | 257/E21.272 |
| 10,304,718 B2 * | 5/2019 | Shiraiwa ............. H01L 21/6831 |
| 2001/0046112 A1 | 11/2001 | Herchen |
| 2008/0237819 A1 | 10/2008 | Wieland et al. |
| 2009/0235866 A1 | 9/2009 | Kataigi et al. |

(Continued)

FOREIGN PATENT DOCUMENTS

| JP | H11-026565 A1 | 1/1999 |
| JP | 2006-060040 A1 | 3/2006 |
| JP | 2006060040 A * | 3/2006 |

(Continued)

OTHER PUBLICATIONS

International Search Report and Written Opinion (Application No. PCT/JP018/038410) dated Jan. 8, 2019.

(Continued)

*Primary Examiner* — Thienvu V Tran
*Assistant Examiner* — Sreeya Sreevatsa
(74) *Attorney, Agent, or Firm* — Burr & Brown, PLLC

(57) ABSTRACT

An electrostatic chuck has a structure in which an electrostatic electrode is embedded in a disk-like ceramic plate and attracts a wafer that is placed on the ceramic plate and that has a diameter smaller than that of the ceramic plate by Johnsen-Rahbek force. The electrostatic chuck includes an insulating film that has an electric resistance larger than that of the ceramic plate in an annular region of a front surface of the ceramic plate from an outer circumferential edge of the ceramic plate to the inside of an outer circumferential edge of the wafer that is placed on the ceramic plate.

6 Claims, 6 Drawing Sheets

(56) References Cited

U.S. PATENT DOCUMENTS

2017/0069519 A1   3/2017   Shiraiwa

FOREIGN PATENT DOCUMENTS

| | | |
|---|---|---|
| JP | 2009-500835 A1 | 1/2009 |
| JP | 2009-256789 A1 | 11/2009 |
| JP | 2017-050468 A1 | 3/2017 |

OTHER PUBLICATIONS

English translation of the International Preliminary Report on Patentability (Chapter I) (Application No. PCT/JP2018/038410) dated Apr. 30, 2020.

* cited by examiner

ELECTROSTATIC CHUCK HAVING AN ANNULAR OUTER REGION COVERED BY AN INSULATING FILM

BACKGROUND OF THE INVENTION

1. Field of the Invention

The present invention relates to an electrostatic chuck.

2. Description of the Related Art

An electrostatic chuck that attracts and holds a wafer by Johnsen-Rahbek force is known. In such an electrostatic chuck, an electrostatic electrode is typically embedded in an AlN ceramic plate. When a voltage is applied to the electrostatic electrode, electric charge that is generated in the AlN ceramic plate moves to the uppermost front surface of the AlN ceramic plate, electric charge having opposite polarity is generated on the back surface of the wafer against the electric charge on the uppermost front surface, and consequently, the wafer is strongly attracted to the AlN ceramic plate. Such an electrostatic chuck is disclosed in, for example, PTL 1. An electrostatic chuck in PTL 1 includes a circular bank on the outermost circumference of a front surface of an AlN ceramic plate in which an electrostatic electrode is embedded. A circular projecting portion for placing a wafer is formed on the front surface of the ceramic plate inside the circular bank. The diameter of the circular projecting portion is smaller than the diameter of the wafer. An inner circumferential edge of the circular bank is formed so as to be much larger than the wafer. Accordingly, when the wafer is placed on the circular projecting portion, the wafer is guided by the circular bank, and the size of a gap between the inner circumferential edge of the circular bank and the wafer falls within the range of a predetermined clearance.

CITATION LIST

Patent Literature

PTL 1: JP 2009-256789 A (FIG. 4)

SUMMARY OF THE INVENTION

When a conductive film is deposited on a front surface of the wafer by using such an electrostatic chuck, the conductive film is deposited also on a part of a front surface (exposed surface) of the ceramic plate that is not covered by the wafer. When the wafer and the AlN ceramic plate are connected to each other with the conductive film interposed therebetween, the surface of the ceramic plate and the wafer have the same electric potential, sufficient Johnsen-Rahbek force is not generated, and attracting force decreases.

The present invention has been accomplished to solve the above problem, and a main object of the present invention is to continue to maintain generation of the Johnsen-Rahbek force.

An electrostatic chuck according to the present invention is an electrostatic chuck that has a structure in which an electrostatic electrode is embedded in a disk-like ceramic plate. The electrostatic chuck attracts a wafer that is placed on the ceramic plate and that has a diameter smaller than that of the ceramic plate by Johnsen-Rahbek force. The electrostatic chuck includes an insulating film that has an electric resistance larger than that of the ceramic plate at least in an annular region of a front surface of the ceramic plate from a position that is related to an outer circumferential edge of the electrostatic electrode to an inside of an outer circumferential edge of the wafer that is placed on the ceramic plate.

When a conductive film is deposited on a front surface of the wafer by using the electrostatic chuck, the conductive film is deposited also on a region of the front surface of the ceramic plate outside the wafer. In this case, even when the conductive film that is deposited on the front surface of the wafer and the conductive film that is deposited on the front surface of the ceramic plate are electrically connected to each other, a portion of the conductive film that is deposited on the front surface of the ceramic plate at least just above the electrostatic electrode is electrically insulated from the ceramic plate by the insulating film. Accordingly, the wafer and a part of the front surface of the ceramic plate just above the electrostatic electrode do not have the same electric potential. When the wafer on which the conductive film is deposited is replaced into a new wafer, the outer circumferential edge of the wafer is placed on the conductive film that is deposited on the insulating film of the ceramic plate in some cases. If there is no insulating film, when a voltage is applied to the electrostatic electrode, the wafer and the part of the front surface of the ceramic plate just above the electrostatic electrode have the same electric potential with the conductive film interposed therebetween. However, there is the insulating film here, and the wafer and the part of the front surface of the ceramic plate just above the electrostatic electrode do not have the same electric potential. Consequently, the electrostatic chuck can continue to generate the Johnsen-Rahbek force. Even when the wafer and a part of the front surface of the ceramic plate outside the part just above the electrostatic electrode have the same electric potential with the conductive film interposed therebetween, a difference in electric potential is made between the wafer and the part of the front surface of the ceramic plate just above the electrostatic electrode. Accordingly, the Johnsen-Rahbek force can continue to be generated.

In the electrostatic chuck according to the present invention, the annular region may be a region of the front surface of the ceramic plate from an outer circumferential edge of the ceramic plate to the inside of the outer circumferential edge of the wafer that is placed on the ceramic plate. In this way, the insulating film extends on the front surface of the ceramic plate from the outer circumferential edge of the ceramic plate to the inside of the outer circumferential edge of the wafer that is placed on the ceramic plate, and the wafer and the front surface of the ceramic plate do not have the same electric potential. Consequently, the electrostatic chuck can continue to generate the Johnsen-Rahbek force with more certainty.

The electrostatic chuck according to the present invention may include a circular projecting portion for placing the wafer on the front surface of the ceramic plate. The circular projecting portion may be disposed such that the outer circumferential edge of the wafer protrudes outward from the circular projecting portion when the wafer is placed on the circular projecting portion. The insulating film may be disposed on the front surface of the ceramic plate outside the circular projecting portion. In this case, the position of a front surface (wafer-placed surface) of the circular projecting portion may be higher than that of the front surface of the insulating film. In this way, a step between the wafer-placed surface and the front surface of the insulating film facilitates maintaining a state where the conductive film that is deposited on the front surface of the wafer and the conductive film that is deposited on the front surface of the insulating film of the ceramic plate are electrically isolated from each other. Accordingly, the electrostatic chuck can continue to generate the Johnsen-Rahbek force with more certainty.

The electrostatic chuck according to the present invention that includes the circular projecting portion may include a circular groove along an outer circumference of the circular projecting portion. The circular groove may be formed such that the outer circumferential edge of the wafer that is placed on the circular projecting portion is located in a space above the circular groove. In this way, the presence of the circular groove further facilitates maintaining a state where the conductive film that is deposited on the front surface of the wafer and the conductive film that is deposited on the front surface of the insulating film of the ceramic plate are electrically isolated from each other. Accordingly, the electrostatic chuck can continue to generate the Johnsen-Rahbek force with more certainty.

The electrostatic chuck according to the present invention that includes the circular groove may include a circular bank on the front surface of the ceramic plate outside the circular groove. This enables the wafer that is placed on the circular projecting portion to be prevented from being greatly misaligned and prevented from falling from the circular projecting portion.

In the electrostatic chuck according to the present invention, the insulating film may be disposed also on a side surface of the ceramic plate. This prevents the wafer and the ceramic plate from having the same electric potential with the conductive film interposed therebetween even when the conductive film comes into contact with the side surface of the ceramic plate.

DETAILED DESCRIPTION OF THE INVENTION

First Embodiment

An electrostatic chuck 10 according to a preferred embodiment of the present invention will now be described.

Figure 1:
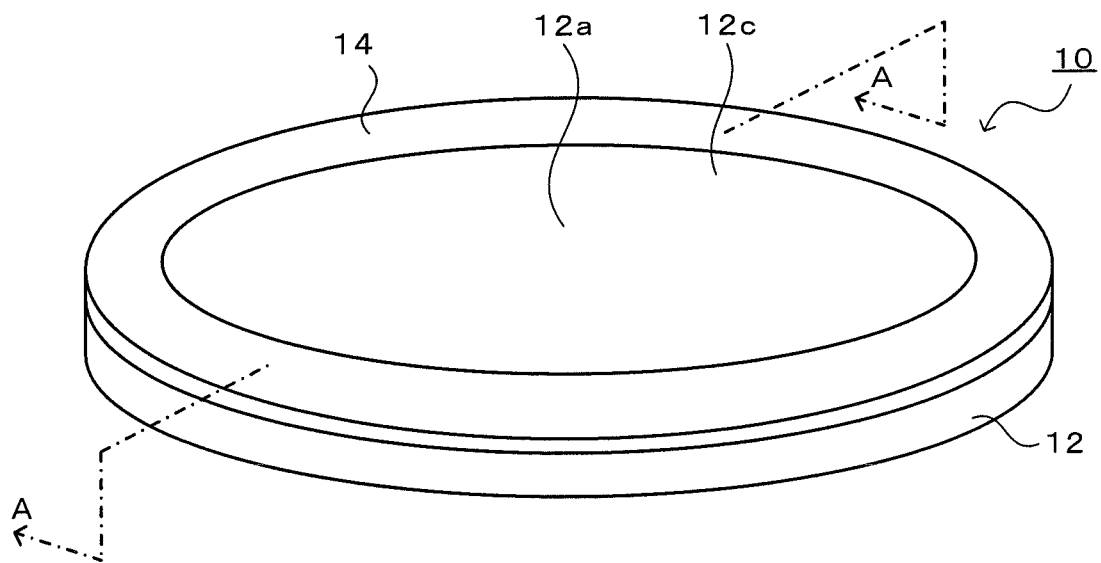
FIG. 1 is a perspective view of an electrostatic chuck 10.
Figure 2:
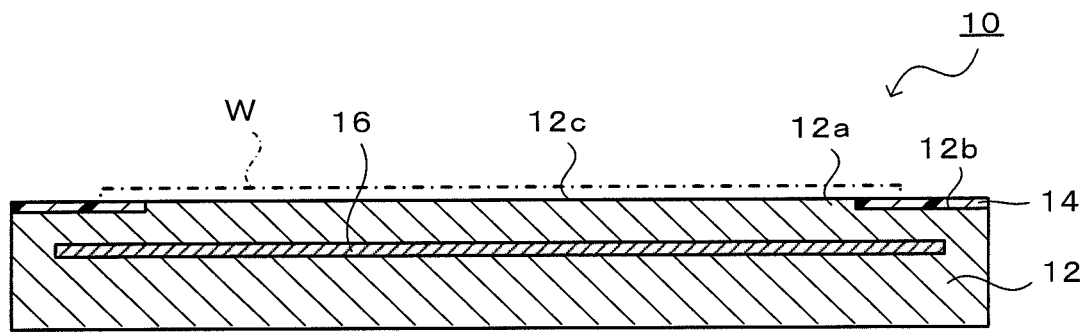
FIG. 2 is an A-A sectional view in FIG. 1.

FIG. 1 is a perspective view of the electrostatic chuck 10. FIG. 2 is an A-A sectional view in FIG. 1.

In the electrostatic chuck 10, an electrostatic electrode 16 is built in a ceramic plate 12. The ceramic plate 12 is an AlN ceramic disk. A circular projecting portion 12a that is concentric with the ceramic plate 12 and that has a low height is disposed on the front surface of the ceramic plate 12. A front surface of the circular projecting portion 12a is a wafer-placed surface 12c. An annular region 12b is a region (region outside the circular projecting portion 12a) of the front surface of the ceramic plate 12 from the outer circumferential edge of the ceramic plate 12 to the inside of the outer circumferential edge of a wafer W that is placed on the wafer-placed surface 12c. The position of the annular region 12b is lower than that of the wafer-placed surface 12c by one step and is covered by an insulating film 14 that has an electric resistance larger than that of AlN. The height of the insulating film 14 is substantially the same as the height of the wafer-placed surface 12c. Examples of the material of the insulating film 14 include an alumina ceramic material and a highly-resistant, organic material (such as a resin). The diameter of the wafer W is larger than the diameter of the wafer-placed surface 12c and smaller than the diameter of the ceramic plate 12. The electrostatic electrode 16 is a circular, flat plate that has a diameter slightly smaller than that of the ceramic plate 12 and that is concentric with the ceramic plate 12. The electrostatic electrode 16 is parallel to the wafer-placed surface 12c. Examples of the material of the electrostatic electrode 16 include Mo, W, Mo alloy and W alloy. A direct voltage is applied to the electrostatic electrode 16 from the back surface of the ceramic plate 12 via a power supply rod not illustrated.

An example of the use of the electrostatic chuck 10 that has such a structure will now be described. The wafer W is first placed on the wafer-placed surface 12c of the electrostatic chuck 10 with the electrostatic chuck 10 installed in a vacuum chamber not illustrated. At this time, the outer circumferential edge of the wafer W protrudes outward from the wafer-placed surface 12c and is placed on the insulating film 14. The vacuum chamber is decompressed by a vacuum pump and adjusted to achieve a predetermined degree of vacuum. A direct voltage is applied to the electrostatic electrode 16 of the electrostatic chuck 10 to generate Johnsen-Rahbek force (JR force), and the wafer W is attracted and secured to the wafer-placed surface 12c. Subsequently, a reactive gas atmosphere at a predetermined pressure (for example, several tens of Pa to several hundreds of Pa) is created in the vacuum chamber. In this state, a high-frequency voltage is applied between an upper electrode not illustrated and the electrostatic electrode 16 of the electrostatic chuck 10 to generate plasma. According to the present embodiment, the generated plasma causes a conductive film F1 to be deposited on the front surface of the wafer W.

Figure 3:
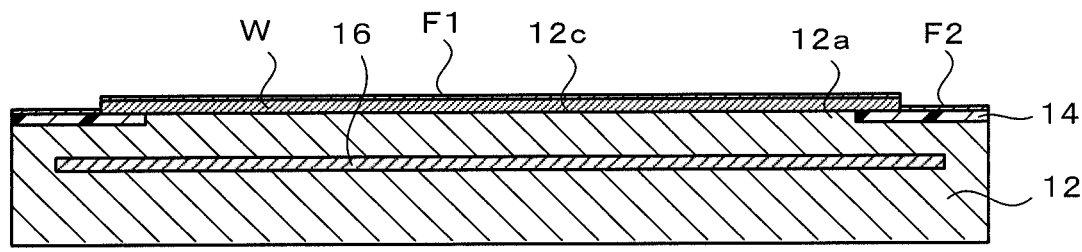
FIG. 3 illustrates a state where a conductive film F1 is deposited on a wafer W with a sectional view.

At this time, a conductive film F2 is deposited also on a region of the front surface of the ceramic plate 12 outside the wafer W. FIG. 3 illustrates a state at this time with a sectional view. In FIG. 3, even when the conductive film F1 that is deposited on the front surface of the wafer W and the conductive film F2 that is deposited on the front surface of the ceramic plate 12 are electrically connected to each other, the conductive film F2 is electrically insulated from the ceramic plate 12 by the insulating film 14. Accordingly, the front surface of the ceramic plate 12 and the wafer W do not have the same electric potential, and the electrostatic chuck 10 can continue to generate sufficient JR force.

Figure 4:
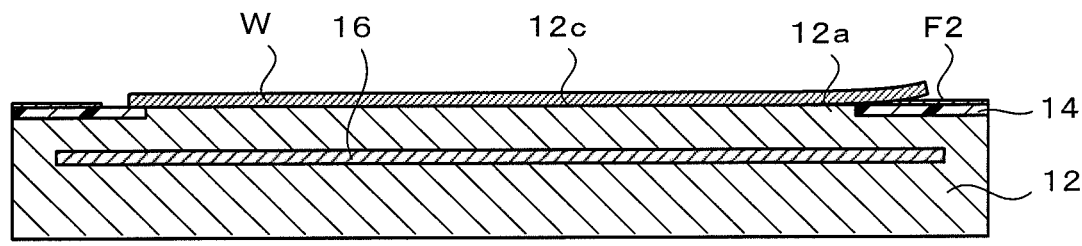
FIG. 4 illustrates a state where the wafer W is placed on a conductive film F2 on an insulating film 14 with a sectional view.

In the case where the conductive film F1 is deposited on the front surface of the wafer W by using the electrostatic chuck 10, the wafer W is removed from the wafer-placed surface 12c after the conductive film F1 with a predetermined thickness is deposited on the front surface of the wafer W, a new wafer W is placed on the wafer-placed surface 12c, and the conductive film F1 with the predetermined thickness is deposited on the front surface of the wafer W. In some cases where these processes are repeated and the wafer W is slightly misaligned, the outer circumferential edge of wafer W is placed on the conductive film F2 on the insulating film 14. FIG. 4 illustrates a state at this time. At this time, if a portion of the insulating film 14 is composed of AlN ceramics, the front surface of the ceramic plate 12 and the wafer W have the same electric potential with the conductive film F2 interposed therebetween, and sufficient JR force is not obtained even when a voltage is applied to the electrostatic electrode 16. According to the present embodiment, however, there is the insulating film 14. Accordingly, the front surface of the ceramic plate 12 and the wafer W do not have the same electric potential with the conductive film F2 interposed therebetween. Accordingly, when a voltage is applied to the electrostatic electrode 16, the electrostatic chuck 10 can continue to generate sufficient JR force.

The electrostatic chuck 10 described above can continue to generate sufficient JR force even when the processes of depositing the conductive film F1 on the wafer W are repeated by using the electrostatic chuck 10. In addition, the ceramic plate 12, which is composed of AlN ceramics, has volume resistivity (for example, about $10^8$ to $10^{12}$ Ω·cm) that is suitable to generate the JR force.

Second Embodiment

Figure 5:
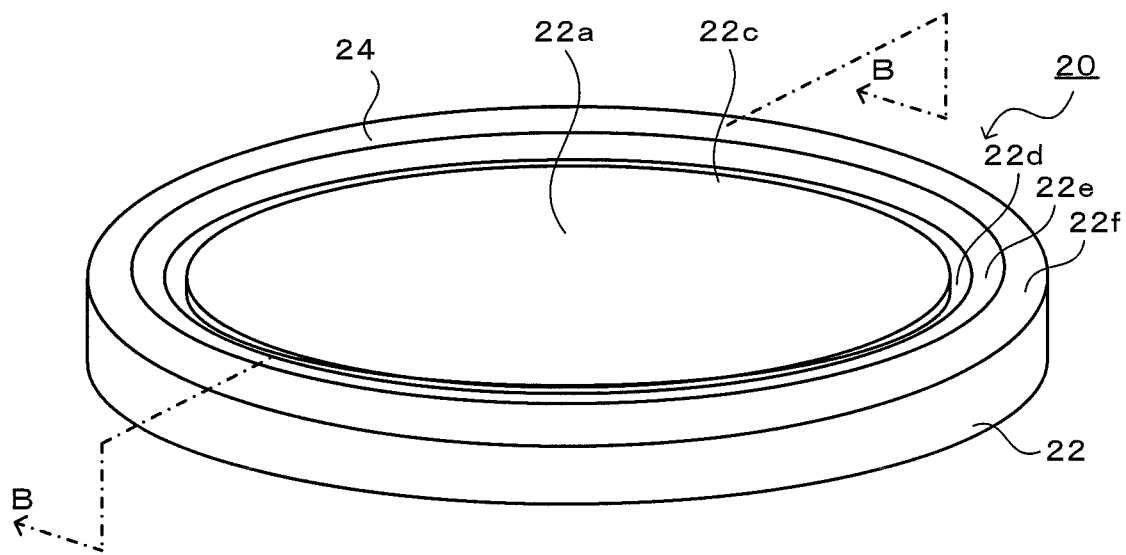
FIG. 5 is a perspective view of an electrostatic chuck 20.
Figure 6:
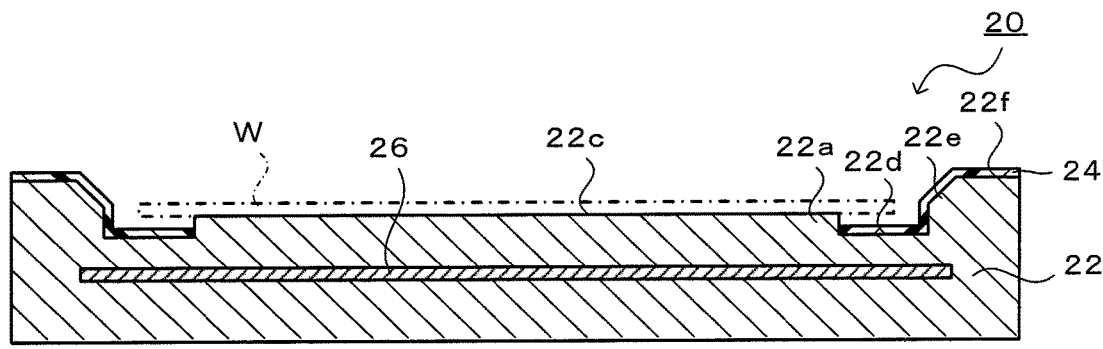
FIG. 6 is a B-B sectional view in FIG. 5.

An electrostatic chuck 20 according to a preferred embodiment of the present invention will now be described. FIG. 5 is a perspective view of the electrostatic chuck 20. FIG. 6 is a B-B sectional view in FIG. 5.

In the electrostatic chuck 20, an electrostatic electrode 26 is built in a ceramic plate 22. The ceramic plate 22 is an AlN ceramic disk. A circular projecting portion 22a that is concentric with the ceramic plate 22 and that has a low height is disposed on the front surface of the ceramic plate 22. A circular groove 22d is formed along the outer circumference of the circular projecting portion 22a. A circular bank 22e is formed outside the circular groove 22d. A front surface of the circular projecting portion 22a is a wafer-placed surface 22c. The position of the bottom surface of the circular groove 22d is lower than that of the wafer-placed surface 22c. The circular bank 22e is a bowl-like surface that inclines downward from the outside toward the inside. An annular, flat surface 22f is formed outside the circular bank 22e at a position higher than that of the wafer-placed surface 22c. A region from the outer circumferential edge of the ceramic plate 22 to the inside of the outer circumferential edge of the wafer W that is placed on the wafer-placed surface 22c (that is, the annular, flat surface 22f, the circular bank 22e, and the bottom surface of the circular groove 22d) is covered by an insulating film 24 that has an electric resistance larger than that of AlN. Examples of the material of the insulating film 24 include an alumina ceramic material and a highly-resistant, organic material (such as a resin). The height of the insulating film 24 that covers the bottom surface of the circular groove 22d is lower than that of the wafer-placed surface 22c. The diameter of the wafer W is larger than the diameter of the wafer-placed surface 22c and smaller than the diameter of the inner circumferential edge of the circular bank 22e. Accordingly, when the wafer W is placed on the wafer-placed surface 22c so as to be concentric therewith, the outer circumferential edge of the wafer W is located in a space above the circular groove 22d. The electrostatic electrode 26 is the same as the electrostatic electrode 16 according to the first embodiment, and a description thereof is omitted here.

An example of the use of the electrostatic chuck 20 that has such a structure will now be described. The wafer W is first placed on the wafer-placed surface 22c of the electrostatic chuck 20 with the electrostatic chuck 20 installed in the vacuum chamber not illustrated. At this time, the wafer W is guided by the circular bank 22e and placed thereon such that the size of a gap between the inner circumferential edge of the circular bank 22e and the wafer W falls within the range of a predetermined clearance. Accordingly, the wafer W is placed at a roughly fixed position and is not greatly misaligned from a position at which the wafer W is concentric with the wafer-placed surface 22c. The outer circumferential edge of the wafer W is located in the space above the circular groove 22d. The vacuum chamber is decompressed by the vacuum pump and adjusted to achieve a predetermined degree of vacuum. A direct voltage is applied to the electrostatic electrode 26 of the electrostatic chuck 20 to generate the JR force, and the wafer W is attracted and secured to the wafer-placed surface 22c. Subsequently, a reactive gas atmosphere at a predetermined pressure (for example, several tens of Pa to several hundreds of Pa) is created in the vacuum chamber. In this state, a high-frequency voltage is applied between the upper electrode not illustrated and the electrostatic electrode 26 of the electrostatic chuck 20 to generate plasma. According to the present embodiment, the generated plasma causes the conductive film F1 to be deposited on the front surface of the wafer W.

Figure 7:
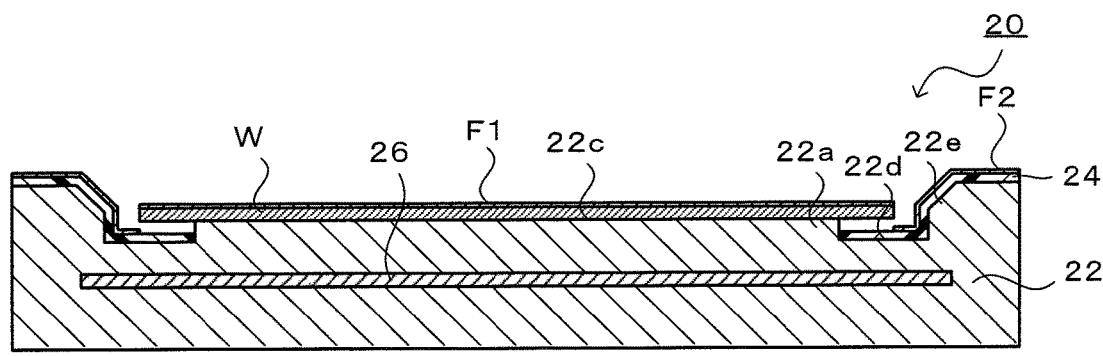
FIG. 7 illustrates a state where the conductive film F1 is deposited on the wafer W with a sectional view.

At this time, the conductive film F2 is deposited also on a region of the front surface of the ceramic plate 22 outside the wafer W. FIG. 7 illustrates a state at this time with a sectional view. In FIG. 7, since the outer circumferential edge of the wafer W is located in the space above the circular groove 22d, the conductive film F1 that is deposited on the front surface of the wafer W and the conductive film F2 that is deposited on the front surface of the ceramic plate 22 are hardly electrically connected to each other. Even if these are connected to each other, the conductive film F2 is electrically insulated from the ceramic plate 22 by the insulating film 24. Accordingly, the front surface of the ceramic plate 22 and the wafer W do not have the same electric potential, and the electrostatic chuck 20 can continue to generate sufficient JR force.

Figure 8:
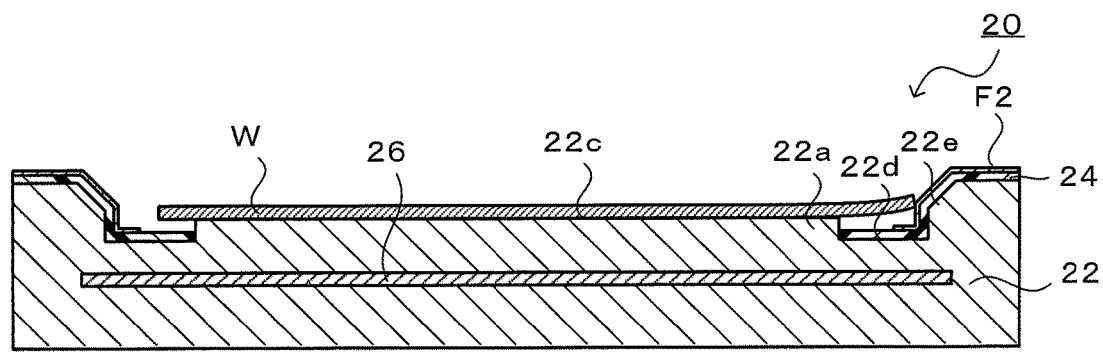
FIG. 8 illustrates a state where the wafer W is placed on the conductive film F2 on the insulating film 24 with a sectional view.

In the case where the conductive film F1 is deposited on the front surface of the wafer W by using the electrostatic chuck 20, the wafer W is removed from the wafer-placed surface 22c after the conductive film F1 with a predetermined thickness is deposited on the front surface of the wafer W, a new wafer W is placed on the wafer-placed surface 22c, and the conductive film F1 with the predetermined thickness is deposited on the front surface of the wafer W. In some cases where these processes are repeated and the wafer W is slightly misaligned, the outer circumferential edge of wafer W comes into contact with the conductive film F2 on the insulating film 24. FIG. 8 illustrates a state at this time. At this time, if a portion of the insulating film 24 is composed of AlN ceramics, the wafer W and the ceramic plate 22 have the same electric potential with the conductive film F2 interposed between the wafer W and the front surface of the ceramic plate 22, and sufficient JR force is not obtained even when a voltage is applied to the electrostatic electrode 26. According to the present embodiment, however, there is the insulating film 24. Accordingly, the front surface of the ceramic plate 22 and the wafer W do not have the same electric potential with the conductive film F2 interposed therebetween. Accordingly, when a voltage is applied to the electrostatic electrode 26, the electrostatic chuck 20 can continue to generate sufficient JR force.

The electrostatic chuck 20 described above can continue to generate sufficient JR force even when the processes of depositing the conductive film F1 on the wafer W are repeated by using the electrostatic chuck 20. In addition, the ceramic plate 22, which is composed of AlN ceramics, has volume resistivity (for example, about $10^8$ to $10^{12}$ $\Omega \cdot cm$) that is suitable to generate the JR force.

In addition, the presence of the circular groove 22d further facilitates maintaining a state where the conductive film F1 that is deposited on the front surface of the wafer W and the conductive film F2 that is deposited on the insulating film 24 of the ceramic plate 22 are electrically isolated from each other. Accordingly, the electrostatic chuck 20 can continue to generate the JR force with more certainty.

Furthermore, since the wafer W is guided by the circular bank 22e and placed on the wafer-placed surface 22c, the wafer W that is placed on the wafer-placed surface 22c can be prevented from being greatly misaligned and prevented from falling from the wafer-placed surface 22c.

It goes without saying that the present invention is not limited to the above embodiments at all and can be carried out with various embodiments provided that the embodiments are within the technical range of the present invention.

Figure 9:
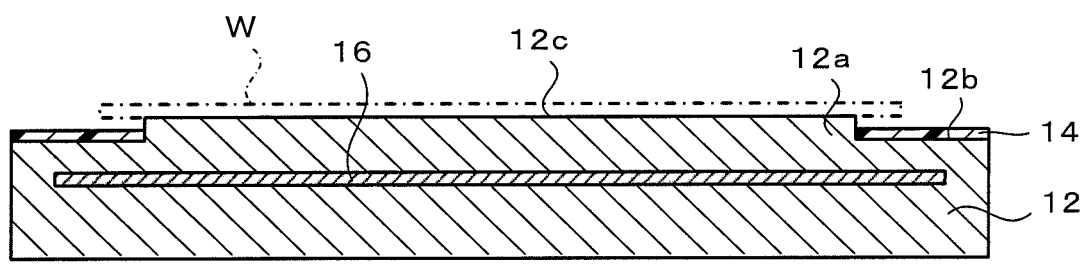
FIG. 9 is a sectional view of a modification to a first embodiment.

For example, as illustrated in FIG. 9, the position of the wafer-placed surface 12c may be higher than that of the front surface of the insulating film 14, although the height of the front surface (the wafer-placed surface 12c) of the circular projecting portion 12a is the same as that of the front surface of the insulating film 14 according to the first embodiment described above. In this way, a step between the wafer-placed surface 12c and the front surface of the insulating film 14 facilitates maintaining a state where the conductive film that is deposited on the front surface of the wafer W and the conductive film that is deposited on the front surface of the insulating film 14 are electrically isolated from each other. Accordingly, the JR force can continue to be generated with more certainty.

Figure 10:
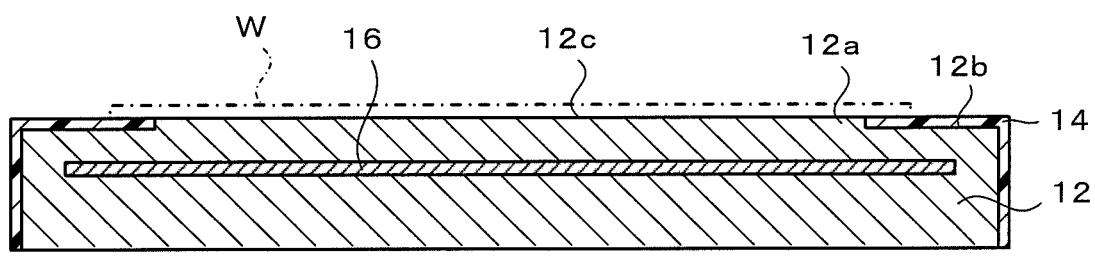
FIG. 10 is a sectional view of a modification to the first embodiment.

According to the first embodiment described above, as illustrated in FIG. 10, the insulating film 14 may be disposed also on a side surface of the ceramic plate 12. This prevents the wafer W and the ceramic plate 12 from having the same electric potential even when the conductive film comes into contact with the side surface of the ceramic plate 12. The same is true for the second embodiment.

According to the first embodiment described above, the electrostatic electrode 16 is built in the ceramic plate 12. However, in addition to this, a heater electrode may be built in, or a RF electrode may be built in. A voltage is applied to the heater electrode from the back surface of the ceramic plate 12 via the power supply rod not illustrated. The heater electrode enables the temperature of the wafer W to be adjusted. A high-frequency voltage is applied to the RF electrode from the back surface of the ceramic plate 12 via the power supply rod not illustrated. The same is true for the second embodiment.

A disk-like cooling plate may be joined to the back surface of the ceramic plate 12 according to the first embodiment described above. The cooling plate may be composed of aluminum or aluminum alloy and may have a coolant path therein. The same is true for the second embodiment.

A cylindrical ceramic shaft may be joined to the back surface of the ceramic plate 12 according to the first embodiment described above. The ceramic shaft is preferably manufactured with the same material as that of the ceramic plate 12. The same is true for the second embodiment.

According to the first embodiment described above, the electrostatic electrode 16 that is described by way of example is of a monopole type. However, a bipolar electrostatic electrode may be used. The same is true for the second embodiment.

Figure 11:
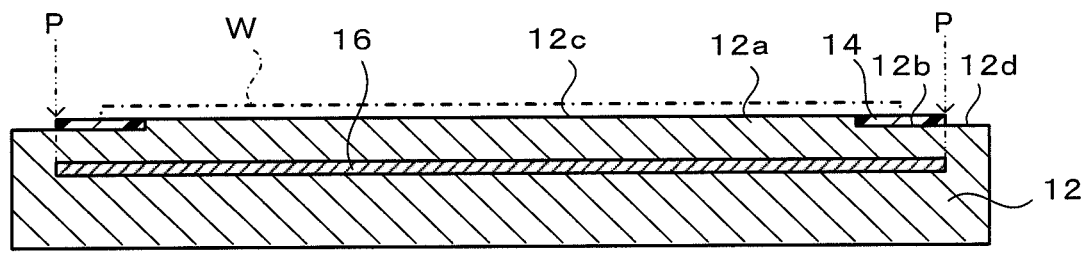
FIG. 11 is a sectional view of a modification to the first embodiment.
Figure 12:
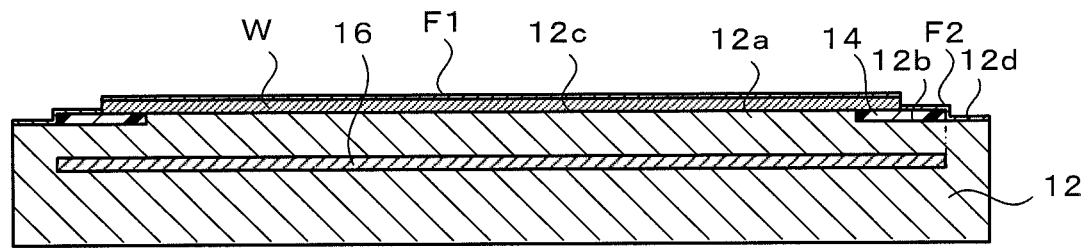
FIG. 12 is a sectional view of a modification to the first embodiment.
Figure 13:
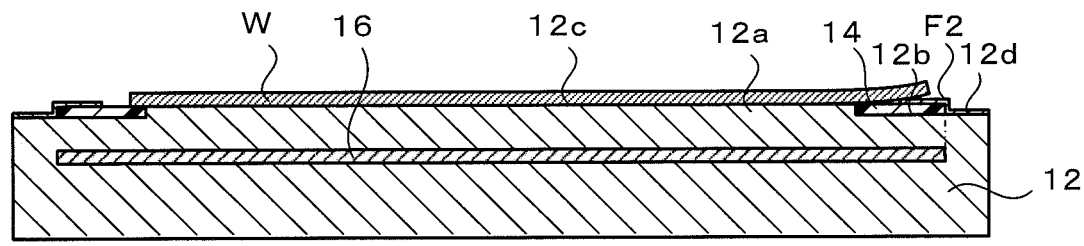
FIG. 13 is a sectional view of a modification to the first embodiment.

According to the first embodiment described above, the annular region 12b that is covered by the insulating film 14 is the region of the front surface of the ceramic plate 12 from the outer circumferential edge of the ceramic plate 12 to the inside of the outer circumferential edge of the wafer W that is placed on the wafer-placed surface 12c. However, the region may be a region illustrated in FIG. 11. That is, the annular region 12b in FIG. 11 is a region of the front surface of the ceramic plate 12 from a position P that is related to the outer circumferential edge of the electrostatic electrode 16 to the inside of the outer circumferential edge of wafer W that is placed on the wafer-placed surface 12c. The annular region 12b is covered by the insulating film 14. However, a region 12d outside the annular region 12b is not covered by the insulating film 14. In this case, as illustrated in FIG. 12, even when the conductive film F2 is deposited also on a region of the front surface of the ceramic plate 12 outside the wafer W, and the conductive film F2 and the conductive film F1 that is deposited on the front surface of the wafer W are electrically connected to each other, a portion of the conductive film F2 at least just above the electrostatic electrode 16 is electrically insulated from the ceramic plate 12 by the insulating film 14. Accordingly, the wafer W and a part of the front surface of the ceramic plate 12 just above the electrostatic electrode 16 do not have the same electric potential. When the wafer W is replaced, as illustrated in FIG. 13, the outer circumferential edge of the wafer W is placed on the conductive film F2 in some cases. In this state, even when a voltage is applied to the electrostatic electrode 16, the wafer W and the part of the front surface of the ceramic plate 12 just above the electrostatic electrode 16 do not have the same electric potential because there is the insulating film 14. Consequently, the electrostatic chuck can continue to generate the Johnsen-Rahbek force. Even when the wafer W and the region 12d outside the part of the front surface of the ceramic plate 12 just above the electrostatic electrode 16 have the same electric potential with the conductive film F2 interposed therebetween, a difference in electric potential is made between the wafer W and the part of the front surface of the ceramic plate 12 just above the electrostatic electrode 16. Accordingly, the Johnsen-Rahbek force can continue to be generated. The same is true for the second embodiment.

The present application claims priority from U.S. Patent Application No. 62/572,697, filed on Oct. 16, 2017, the entire contents of which are incorporated herein by reference.

What is claimed is:
1. An electrostatic chuck that has a structure in which an electrostatic electrode is embedded in a disk-like ceramic plate, the electrostatic chuck attracting a wafer that is placed on the ceramic plate and that has a diameter smaller than that of the ceramic plate by Johnsen-Rahbek force, the electrostatic chuck comprising:

the ceramic plate having a circular projecting portion having an outermost circumferential edge, the electrostatic electrode, which has an outermost circumferential edge, that is embedded in the ceramic plate, and an insulating film that has an electric resistance larger than that of the ceramic plate at least in an annular region of a front surface of the ceramic plate from a position, in a plan view, extending from at least the outermost circumferential edge of the electrostatic electrode to the outermost circumferential edge of the circular projecting portion, which is inside of an outer circumferential edge of the wafer that is placed on the ceramic plate, such that the insulating film is in an overlapping position with the electrostatic electrode in the plan view.

2. The electrostatic chuck according to claim 1, wherein the annular region is a region of the front surface of the ceramic plate from an outer circumferential edge of the ceramic plate to the outermost circumferential edge of the circular portion, which is to the inside of the outer circumferential edge of the wafer that is placed on the ceramic plate.

3. The electrostatic chuck according to claim 1, wherein the circular projecting portion, which is for placing the wafer on the front surface of the ceramic plate, is at a height that is higher than a height of the insulating film, wherein the circular projecting portion is disposed such that the outer circumferential edge of the wafer protrudes outward from the circular projecting portion when the wafer is placed on the circular projecting portion, and wherein the insulating film is disposed on the front surface of the ceramic plate outside the circular projecting portion.

4. The electrostatic chuck according to claim 3, further comprising:

a circular groove along an outer circumference of the circular projecting portion, wherein the circular groove is formed such that the outer circumferential edge of the wafer that is placed on the circular projecting portion is located in a space above the circular groove.

5. The electrostatic chuck according to claim 4, further comprising:

a circular bank on the front surface of the ceramic plate outside the circular groove.

6. The electrostatic chuck according to claim 1, wherein the insulating film is disposed also on a side surface of the ceramic plate.

* * * * *